(12) United States Patent
Vo et al.

(10) Patent No.: US 9,225,322 B2
(45) Date of Patent: Dec. 29, 2015

(54) APPARATUSES AND METHODS FOR PROVIDING CLOCK SIGNALS

(71) Applicant: Micron Technology, Inc., Boise, ID (US)

(72) Inventors: Huy T. Vo, Boise, ID (US); Yantao Ma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 43 days.

(21) Appl. No.: 14/109,341

(22) Filed: Dec. 17, 2013

(65) Prior Publication Data

US 2015/0171849 A1     Jun. 18, 2015

(51) Int. Cl.
*G06F 1/04*     (2006.01)
*H03K 3/00*     (2006.01)
*H03K 5/151*     (2006.01)

(52) U.S. Cl.
CPC .................. *H03K 5/1515* (2013.01)

(58) Field of Classification Search
USPC .............. 327/295, 164; 365/233.11
See application file for complete search history.

(56) References Cited

U.S. PATENT DOCUMENTS

| | | | |
|---|---|---|---|
| 5,254,888 A | 10/1993 | Lee et al. |
| 5,550,515 A | 8/1996 | Liang et al. |
| 5,652,536 A | 7/1997 | Nookala et al. |
| 5,684,418 A | 11/1997 | Yanagiuchi |
| 5,717,353 A | 2/1998 | Fujimoto |
| 5,955,904 A | 9/1999 | Kawasaki |
| 5,964,880 A | 10/1999 | Liu et al. |
| 5,973,525 A | 10/1999 | Fujii |
| 6,011,732 A | 1/2000 | Harrison et al. |
| 6,104,228 A | 8/2000 | Lakshmikumar |
| 6,107,841 A | 8/2000 | Goodnow |
| 6,111,446 A | 8/2000 | Keeth |
| 6,115,443 A | 9/2000 | Wu et al. |
| 6,125,157 A | 9/2000 | Donnelly et al. |
| 6,134,638 A | 10/2000 | Olarig |
| 6,172,531 B1 | 1/2001 | Aipperspach et al. |
| 6,198,689 B1 | 3/2001 | Yamazaki et al. |
| 6,236,251 B1 | 5/2001 | Akamatsu |
| 6,236,275 B1 | 5/2001 | Dent |
| 6,242,954 B1 | 6/2001 | Taniguchi et al. |

(Continued)

FOREIGN PATENT DOCUMENTS

| | | |
|---|---|---|
| JP | 02190733 | 7/1990 |
| JP | 04-345996 | 12/1992 |

(Continued)

OTHER PUBLICATIONS

Jung, Y et al., "A Duel-Loop Delay-Locked Loop Using Multiple Voltage-Controlled Delay Lines", IEEE Journal of Solid-State Circuits, vol. 36, No. 5, May 2001, 784-791.

*Primary Examiner* — Adam Houston
(74) *Attorney, Agent, or Firm* — Dorsey & Whitney LLP (57) ABSTRACT

Apparatuses and methods for providing clock signals are described herein. An example apparatus may include a clock generator circuit. The clock generator circuit may be configured to selectively provide first and second intermediate signals to a multiplexer in a clock path to provide an output clock signal with a first frequency when operating in a first mode and to selectively provide the first and second intermediate clock signals to the multiplexer in the clock path to provide the output clock signal with a second frequency when operating in a second mode.

21 Claims, 4 Drawing Sheets

(56) References Cited

U.S. PATENT DOCUMENTS

| | | |
|---|---|---|
| 6,323,715 B1 | 11/2001 | Vatinel |
| 6,326,826 B1 | 12/2001 | Lee et al. |
| 6,327,196 B1 | 12/2001 | Mullarkey |
| 6,333,893 B1 | 12/2001 | Keeth et al. |
| 6,335,901 B1 | 1/2002 | Morita et al. |
| 6,339,553 B1 | 1/2002 | Kuge |
| 6,377,091 B1 | 4/2002 | Williams et al. |
| 6,434,083 B2 | 8/2002 | Lim |
| 6,453,425 B1 | 9/2002 | Hede et al. |
| 6,490,207 B2 | 12/2002 | Manning |
| 6,552,955 B1 | 4/2003 | Miki |
| 6,597,162 B2 | 7/2003 | Niratsuka |
| 6,600,345 B1 | 7/2003 | Boutaud |
| 6,621,315 B2 | 9/2003 | Heo et al. |
| 6,690,241 B2 | 2/2004 | Ooishi |
| 6,865,135 B2 | 3/2005 | Choi |
| 6,876,185 B2 | 4/2005 | Niratsuka |
| 6,914,852 B2 | 7/2005 | Choi |
| 6,980,480 B2 | 12/2005 | Choi |
| 7,042,258 B2 | 5/2006 | Booth et al. |
| 7,109,807 B2 | 9/2006 | Lin |
| 7,129,794 B2 | 10/2006 | Lin |
| 7,132,898 B2 | 11/2006 | Lin |
| 7,259,604 B2 | 8/2007 | Gomm |
| 7,276,943 B2 | 10/2007 | Starr et al. |
| 7,375,593 B2 | 5/2008 | Self |
| 7,463,099 B2 | 12/2008 | Lin |
| 7,492,198 B2 | 2/2009 | Suda |
| 7,508,277 B2 | 3/2009 | Kuo et al. |
| 7,511,579 B2 | 3/2009 | Wang et al. |
| 7,567,140 B2 | 7/2009 | Kim |
| 7,629,822 B2 | 12/2009 | Kim et al. |
| 7,639,090 B2 | 12/2009 | Lin |
| 7,688,123 B2 | 3/2010 | Oh |
| 7,821,343 B1 * | 10/2010 | Wong et al. ............ 331/2 |
| 7,928,782 B2 | 4/2011 | Booth et al. |
| 8,022,778 B2 | 9/2011 | Nagaraj et al. |
| 8,050,643 B1 * | 11/2011 | Wu et al. ............ 455/234.1 |
| 8,169,242 B2 | 5/2012 | Abbasi et al. |
| 8,207,768 B2 | 6/2012 | Booth et al. |
| 8,432,202 B2 | 4/2013 | Booth et al. |
| 2002/0144173 A1 | 10/2002 | Jeddeloh |
| 2003/0085744 A1 | 5/2003 | Heo et al. |
| 2004/0179419 A1 | 9/2004 | Choi |
| 2004/0202263 A1 | 10/2004 | Choi |
| 2004/0202264 A1 | 10/2004 | Choi |
| 2006/0078079 A1 | 4/2006 | Lu |
| 2006/0208804 A1 | 9/2006 | Kuo et al. |
| 2006/0259807 A1 | 11/2006 | Sachs et al. |
| 2007/0066268 A1 | 3/2007 | Simic et al. |
| 2008/0112526 A1 | 5/2008 | Yi |
| 2008/0284529 A1 | 11/2008 | Refeld et al. |
| 2008/0297215 A1 | 12/2008 | Ma |
| 2009/0225915 A1 * | 9/2009 | Hassan et al. ............ 375/354 |
| 2009/0228227 A1 | 9/2009 | Suda |
| 2009/0267663 A1 | 10/2009 | Varricchione |
| 2010/0039137 A1 | 2/2010 | Okyay et al. |
| 2010/0188125 A1 | 7/2010 | Booth et al. |
| 2010/0215120 A1 * | 8/2010 | Groe et al. ............ 375/297 |
| 2011/0074477 A1 | 3/2011 | Nagarajan et al. |
| 2011/0175655 A1 | 7/2011 | Booth et al. |
| 2011/0279156 A1 | 11/2011 | Abbasi et al. |
| 2012/0235721 A1 | 9/2012 | Booth et al. |
| 2015/0063042 A1 * | 3/2015 | Plavec et al. ............ 365/189.07 |
| 2015/0091851 A1 * | 4/2015 | Reynolds ............ 345/174 |
| 2015/0091864 A1 * | 4/2015 | Reynolds ............ 345/174 |

FOREIGN PATENT DOCUMENTS

| | | |
|---|---|---|
| JP | 08-179847 | 7/1996 |
| JP | 10-303747 | 11/1998 |
| JP | 2000-315940 | 11/2000 |
| JP | 2000-339055 | 12/2000 |

\* cited by examiner

FIG. 5

APPARATUSES AND METHODS FOR PROVIDING CLOCK SIGNALS

BACKGROUND

As memory clock speeds continue to rise, clock signal reliability and accuracy have become increasingly important, particularly with respect to amplitude, frequency, and distortion. In many cases, a memory may operate using several clock signals. For example, a memory may operate in different modes using different frequency clock signals. In some instances, a memory may receive a global clock signal and internally derive various clock signals having different frequencies from the global clock signal.

In higher frequency memories, operation according to multiple frequency clock signals may require use of smaller set up and hold margins. Margins, however, must nonetheless be sufficiently large such that signals are properly captured. A known approach to minimize misalignment of clock signals is to provide each clock signal through a matching clock path. In this manner, clock signals may be better aligned. However, due to inherent variations in components of each clock path, some variation in clock alignment may persist, preventing further decrease in the margins and as a result preventing further increase in frequency while maintaining stable operation.

DETAILED DESCRIPTION

Apparatuses and methods for providing clock signals are described herein. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

A memory may operate in a full rate mode (e.g., 1N operation) or a reduced rate mode (e.g., 2N operation). In a full rate mode, a memory may operate according to a full rate clock signal and in a reduced rate mode, a memory may operate according to a reduced rate clock signal. In some examples, full rate clock signals and reduced rate clock signals may have different frequencies, for example, the reduced rate clock signals having lower frequencies than the full rate clock signals, such that a memory may selectively operate at different speeds. As described herein, in some examples, a memory may be configured to receive an input clock signal (e.g., global clock signal) and internally provide a clock signal comprising one or more of the full rate clock signal and the reduced rate clock signal. The reduced rate clock signal may be based on the input clock signal. Moreover, in some examples, a memory may be configured to provide a phase shifted reduced rate clock signal. The phase shifted reduced rate clock signal may, for instance, be phase shifted 90 degrees from the reduced rate clock signal and may be provided during the reduced rate mode.

Figure 1:
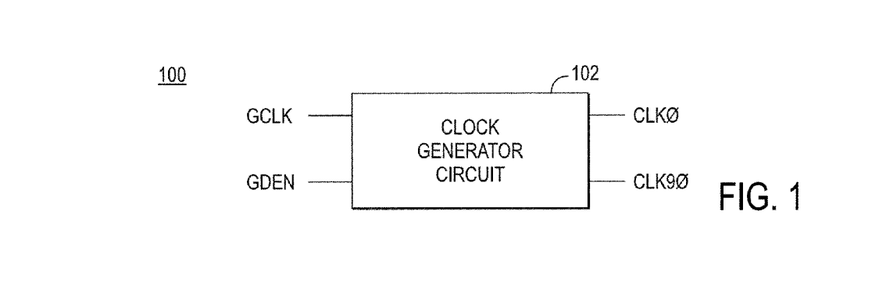
FIG. 1 is a block diagram of an apparatus according to an embodiment of the present invention.

FIG. 1 is a block diagram of an apparatus 100 according to an embodiment of the present invention. As used herein, an apparatus may refer to, for example, an integrated circuit, a memory device, a memory system, an electronic device or system, a smart phone, a tablet, a computer, a server, etc. The apparatus 100 may include a clock generator circuit 102. The clock generator circuit 102 may be configured to receive an input clock signal GCLK and a control signal GDEN and may further be configured to provide output clock signals CLK0, CLK90. The clock generator circuit 102 may be configured to operate in various modes of operation, including a full rate mode and a reduced rate mode, as described. Accordingly, the output clock signal CLK0 may be a full rate clock signal when the clock generator circuit 102 is operating in a full rate mode and may be a reduced rate clock signal when the clock generator circuit 102 is operating in a reduced rate mode. Additionally, the output clock signal CLK90 may be an inactive clock signal (e.g., having a constant clock level, such as being at a constant high clock level or a constant low clock level) when the clock generator circuit 102 is operating in a full rate mode and may be a phase shifted reduced rate clock signal when the clock generator circuit 102 is operating in a reduced rate mode.

In operation, the clock generator circuit 102 may operate in a full rate mode responsive to the control signal GDEN having a logic low state. As a result, the output clock signal may be a full rate clock signal. In response to the control signal GDEN transitioning to a logic high state, the clock generator circuit 102 may operate in a reduced rate mode, and the output clock signal CLK0 may be a reduced rate clock signal. As described, the reduced rate clock signal may have a lower frequency than the full rate clock signal. For example, the reduced rate clock signal may have a frequency that is one-half of the frequency of the full rate signal. The clock signal CLK90 may be a phase shifted reduced rate clock signal while operating in the reduced rate mode. In some examples, the phase shifted reduced rate clock signal may be phase shifted 90 degrees (e.g., 90 degrees leading or 90 degrees lagging) relative to the reduced rate clock signal CLK0.

Accordingly, the clock generator circuit 102 may provide an output clock signal CLK0 that is either a full rate clock signal or a reduced rate clock signal. As will be described in further detail, an output clock signal CLK0 that is a full rate clock signal and an output clock signal CLK0 that is a reduced rate clock signal may be provided by the clock generator circuit 102 using a same clock path. In this manner, timing mismatches associated with providing different frequency clock signals with respective clock paths may be reduced.

Figure 2:
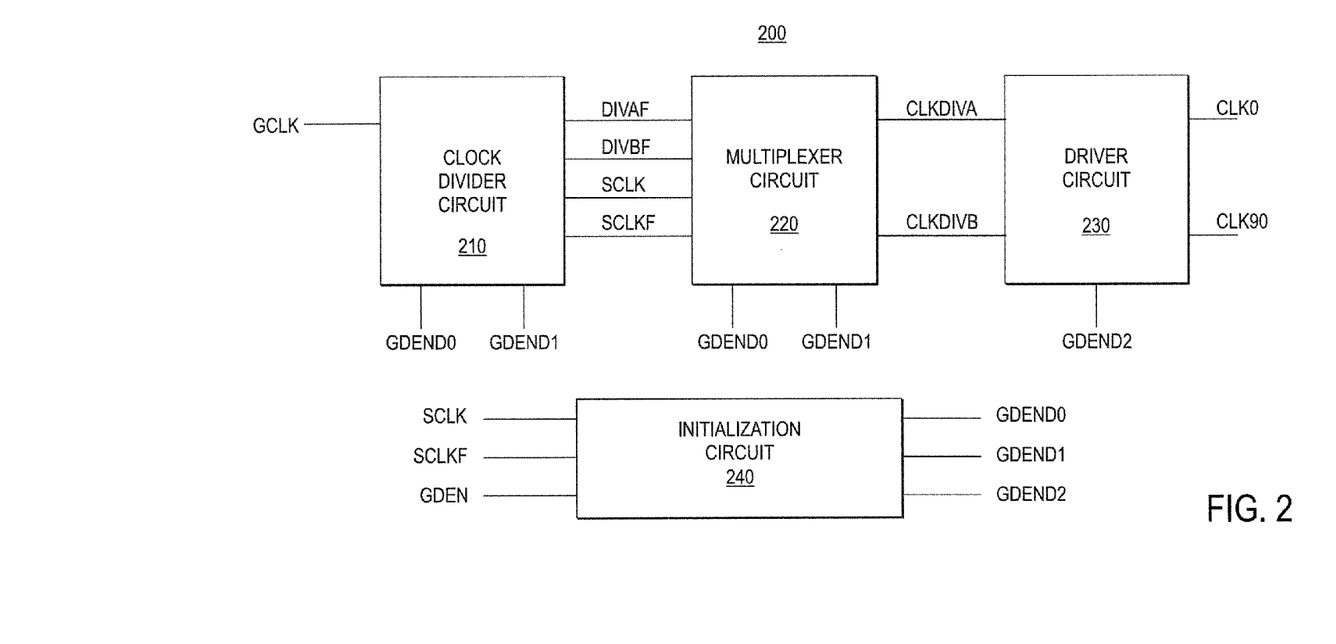
FIG. 2 is a block diagram of a clock generator circuit according to an embodiment of the present invention.

FIG. 2 is a block diagram of a clock generator circuit 200 according to an embodiment of the present invention. The clock generator circuit 200 may include a clock divider circuit 210, a multiplexer circuit 220, a driver circuit 230, and an initialization circuit 240. The clock generator circuit 200 may be used to implement the clock generator circuit 102 of FIG. 1.

The clock divider circuit 210 may be configured to receive the input clock signal GCLK and provide complementary clock signals SCLK, SCLKF. In at least one example, the complementary clock signals SCLK, SCLKF may be based on the input clock signal GCLK. By way of example, the clock divider circuit 210 may be configured to phase split the input clock signal GCLK to provide the complementary clock signals SCLK, SCLKF. Based on the input clock signal GCLK, the clock divider circuit 210 may provide divided clock signals DIVAF and DIVBF. During a reduced rate mode, the divided clock signals DIVAF, DIVBF may, for instance, be provided by dividing each of the complementary clock signals SCLK, SCLKF. The resulting divided clock signals DIVAF, DIVBF have frequencies that are less than the frequencies of the complementary clock signals SCLK, SCLKF. By way of example, the clock signal SCLK may be divided to provide the divided clock signal DIVAF having a frequency one-half of the clock signal SCLK and the clock signal SCLKF may be divided to provide the divided clock signal DIVBF having a frequency one-half of the clock signal SCLKF. During a full rate mode, the divided clock signals DIVAF, DIVBF may be inactive clock signals responsive to the control signals GDEND1 and GDEND2 having a logic low state. By way of example, the divided clock signal DIVAF may have a high clock level responsive to the control signal GDEND1 having a logic low state and the divided clock signal DIVBF may have a high clock level responsive to the control signal GDEND0 having a logic low state.

The multiplexer circuit 220 may be coupled to the clock divider circuit 210 and configured to receive the divided clock signals DIVAF, DIVBF and the complementary clock signals SCLK, SCLKF, and further may be configured to provide adjustable clock signals CLKDIVA, CLKDIVB. During a full rate mode, the adjustable clock signal CLKDIVA may be a full rate clock signal and the adjustable clock signal CLKDIVB may be an inactive clock signal having a high clock level, for instance, responsive to the control signals GDEND0 and GDEND1 having a logic low state. During a reduced rate mode, the adjustable clock signal CLKDIVA may be a reduced rate signal and the adjustable clock signal CLKDIVB may be a phase shifted reduced rate signal.

The driver circuit 230 may be coupled to the multiplexer circuit and configured to receive the adjustable clock signals CLKDIVA, CLKDIVB and further may be configured to provide the output clock signals CLK0, CLK90. The output clock signals CLK0, CLK90 may be based on the adjustable clock signals CLKDIVA, CLKDIVB, respectively. For example, during a full rate mode, the output clock signal CLK0 may be a full rate clock signal and the output clock signal CLK90 may be an inactive clock signal having a high clock level. In at least one embodiment, the output clock signal CLK90 may be an inactive clock signal having a low clock level responsive to the control signal GDEND2 having a logic low state. During a reduced rate mode, the output clock signals CLK0, CLK90 may be a reduced rate clock signal and a phase shifted reduced rate clock signal, respectively.

The initialization circuit 240 may be configured to receive complementary clock signals SCLK, SCLKF and further may receive the control signal GDEN. The initialization circuit 240 may be configured to provide the control signals GDEND0, GDEND1, and GDEND2 based on the complementary clock signals SCLK, SCLKF and the control signal GDEN. By way of example, the initialization circuit 240 may be configured to provide control signals GDEND0, GDEND1, and GDEND2 with a logic high state responsive to the control signal GDEN transitioning to a logic high state. The initialization circuit 240 may be configured to delay providing each control signal GDEND0, GDEND1, and GDEND2 with a logic high state by a respective amount based on the complementary clock signals SCLK, SCLKF.

In an example operation, the clock generator circuit 200 may operate in a full rate mode responsive to the control signal GDEN having a logic low state. In response to the control signal GDEN having a logic low state, the initialization circuit 240 may provide the control signals GDEND0, GDEND1, GDEND2 with a logic low state. The clock divider circuit 210 may receive the input clock signal GCLK and provide the complementary clock signals SCLK, SCLKF based on the input clock signal GCLK. As described, in at least one embodiment, the clock divider circuit 210 may provide the complementary clock signals SCLK, SCLKF responsive to phase splitting the input clock signal GCLK. The clock divider circuit 210 may further provide the divided clock signals DIVAF and DIVBF. Because the control signal GDEN may have a logic low state resulting in the control signals GDEND0 and GDEND1 having a logic low state, the divided clock signals DIVAF and DIVBF may each be inactive clock signals having high clock levels.

The multiplexer circuit 220 may receive the complementary clock signals SCLK, SCLKF and the divided clock signals DIVAF, DIVBF, and may provide adjustable clock signals CLKDIVA and CLKDIVB. In at least one example, the multiplexer circuit 220 may provide each of the adjustable clock signals CLKDIVA and CLKDIVB based on the divided clock signals DIVAF, DIVBF and/or the complementary clock signals SCLK, SCLKF. By way of example, the multiplexer circuit 220 may be configured to provide the adjustable clock signals CLKDIVA, CLKDIVB by multiplexing the divided clock signals DIVAF, DIVBF according to the complementary clock signals SCLK, SCLKF. That is, the multiplexer 220 may provide the adjustable clock signal CLKDIVA responsive to the complementary clock signals SCLK, SCLKF having first respective clock levels and provide the adjustable clock signal CLKDIVB responsive to the complementary clock signals SCLK, SCLKF having second respective clock levels. In this manner, the multiplexer circuit 220 may toggle outputs of respective multiplexers using the complementary clock signals SCLK, SCLKF to provide the adjustable clock signals CLKDIVA, CLKDIVB. The control signals GDEND0 and GDEND1 may have a logic low state because the control signal GDEN may have a logic low state, and the adjustable clock signal CLKDIVA may be a full rate clock signal and the adjustable clock signal CLKDIVB may be an inactive clock signal having a high clock level.

The driver circuit 230 may receive the adjustable clock signals CLKDIVA, CLKDIVB and may provide the output clock signals CLK0, CLK90, respectively. The output clock signal CLK0 may be a full rate clock signal and the output clock signal CLK90 may be an inactive clock signal having a low clock level.

The clock generator circuit 200 may operate in a reduced rate mode in response to the control signal GDEN transitioning to a logic high state. Accordingly, the initialization circuit 240 may provide control signals GDEND0, GDEND1, and GDEND2 with a logic high state. In response to the control signals GDEND0 and GDEND1 having a logic high state, the divided clock signals DIVAF, DIVBF may be provided by dividing the complementary clock signals SCLK, SCLKF, respectively.

The multiplexer circuit 220 may receive the divided clock signals DIVAF, DIVBF and complementary clock signals SCLK, SCLKF and may provide the adjustable clock signals CLKDIVA and CLKDIVB based on the divided clock signals DIVAF, DIVBF and complementary clock signals SCLK, SCLKF. As described, in some instances, the multiplexer circuit 220 may toggle outputs of respective multiplexers using the complementary clock signals SCLK, SCLKF to provide the adjustable clock signals CLKDIVA, CLKDIVB. Responsive to the control signals GDEND0, GDEND1 having a logic high state, the adjustable clock signals CLKDIVA may be a reduced rate clock signal and the adjustable clock signal CLKDIVB may be a phase shifted reduced rate clock signal.

The driver circuit 230 may receive the adjustable clock signals CLKDIVA, CLKDIVB and may provide the output clock signals CLK0, CLK90. As described, the output clock signal CLK0 may be a reduced rate clock signal and the output clock signal CLK90 may be a phase shifted reduced rate clock signal. In at least some examples, the output clock signal CLK90 may be a phase shifted reduced rate clock signal responsive to the control signal GDEND2 having a logic high state.

Transition of the control signal GDEN from a logic low state to a logic high state (e.g., transition to a reduced rate mode) may cause the output clock signal CLK0 to be a reduced rate clock signal and transition of the control signal GDEN from a logic high state to a logic low state (e.g., transition to a full rate mode) may cause the output clock signal CLK0 to be a reduced rate clock signal. In some examples, the output clock signal CLK may be provided in the full rate mode and reduced rate mode using a same clock path through the clock generator circuit 200.

Figure 3:
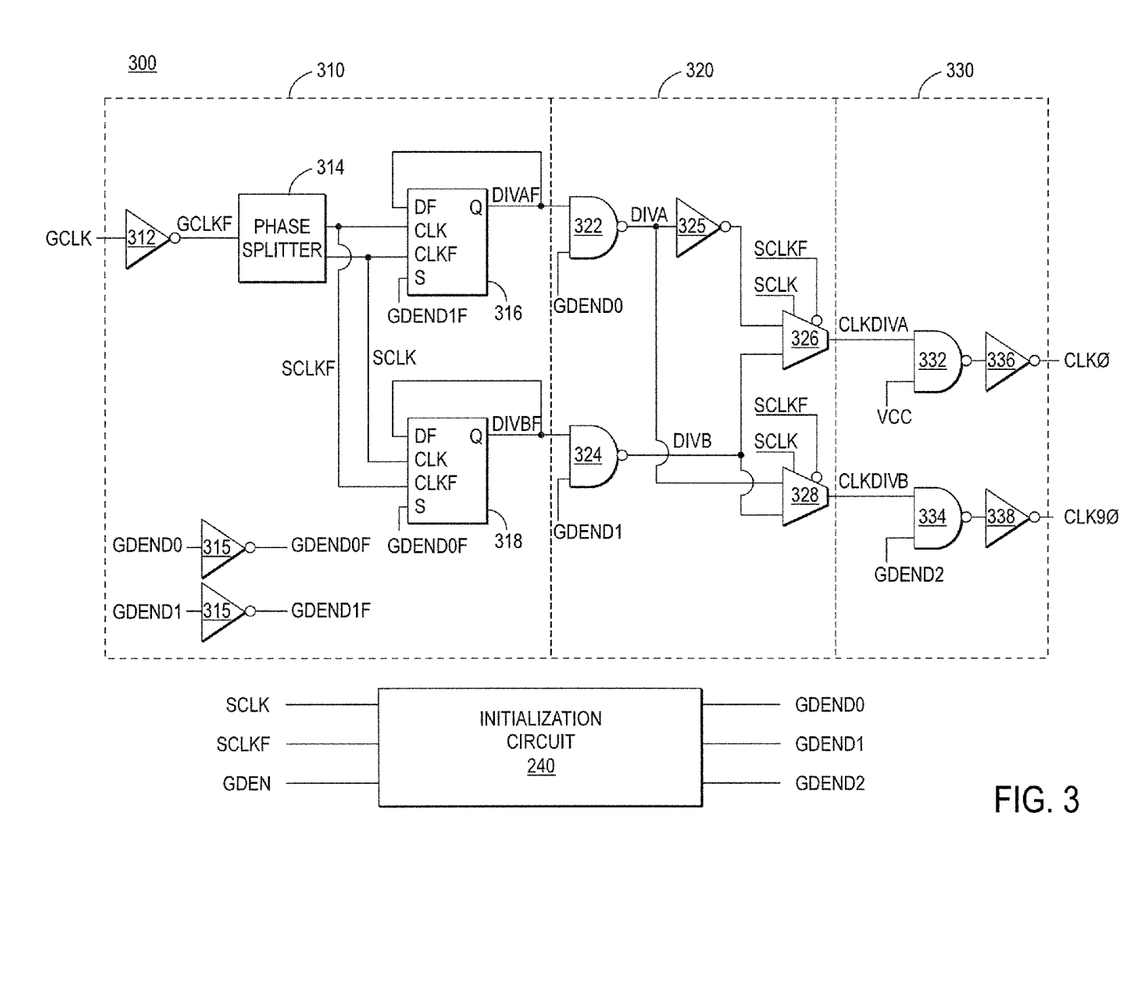
FIG. 3 is a block diagram of a clock generator circuit according to an embodiment of the present invention.

FIG. 3 is a block diagram of a clock generator circuit 300 according to an embodiment of the present invention. The clock generator circuit 300 includes elements that have been previously described with respect to the clock generator circuit 200 of FIG. 2. Those elements have been identified in FIG. 3 using the same reference numbers used in FIG. 2 and operation of the common elements is as previously described. Consequently, a detailed description of the operation of these elements will not be repeated in the interest of brevity.

The clock generator circuit 300 may include a clock divider circuit 310, a multiplexer circuit 320, and a driver circuit 330. The clock divider circuit 310, multiplexer circuit 320, and driver circuit 330 may be used to implement the clock divider circuit 210, multiplexer circuit 220, and a driver circuit 230 of FIG. 2, respectively.

An inverter 312 may be configured to receive the input clock signal GCLK and provide an inverted input clock signal GCLK to a phase splitter 314. The phase splitter 314 may be configured to receive the inverted clock signal GCLK and phase split the inverted input clock signal GCLK to provide the complementary clock signals SCLK, SCLKF.

Flip-flops 316, 318 may receive the complementary clock signals SCLK, SCLKF at respective clock inputs. In some examples, the flip-flop 316 may receive the complementary clock signals SCLKF and SCLK at inputs CLK and CLKF, respectively, and the flip-flop 318 may receive the complementary clock signals SCLKF and SCLK at inputs CLKF and CLK, respectively. As a result the flip-flops 316, 318 may be clocked on opposite clock edges of the input clock signal GCLK.

Each flip-flop 316, 318 may be configured to divide a complementary clock signal (e.g., SCLK or SCLKF) to provide a respective divided clock signal of the divided clock signals DIVAF, DIVBF. For example, the flip-flop 316 may divide the complementary clock signal SCLK to provide the divided clock signal DIVAF and the flip-flop 318 may divide the complementary clock signal SCLKF to provide the divided clock signal DIVBF. The flip-flop 316 may be configured to receive the complement of the control signal GDEND1, that is, GDEND1F, at a set input and accordingly may be set responsive to GDEND1 having a logic low state. Similarly, the flip-flop 318 may be configured to receive the complement of the control signal GDEND0, that is, GDEND0F, at a set input and accordingly may be set responsive to GDEND0 having a logic low state. Thus, responsive to the control signals GDEND0, GDEND1 having logic low states, the divided clock signals DIVAF, DIVBF may be inactive clock signals, that is, clock signals having a constant clock level.

NAND gate 322 may be configured to receive the divided clock signal DIVAF and the control signal GDEND0 and may provide an intermediate clock signal DIVA based, at least in part, on the divided clock signal DIVAF and control signal GDEND0. During a full rate mode, the intermediate clock signal DIVA may be an inactive clock signal having a high clock level, for instance, responsive to the control signal GDEND0 having a logic low state. The intermediate clock signal DIVA may be inverted by inverter 325 to provide an inverted clock signal. NAND gate 324 may be configured to receive the divided clock signal DIVBF and the control signal GDEND1 and may provide an intermediate clock signal DIVB based, at least in part, on the divided clock signal DIVBF and the control signal GDEND1. During a full rate mode, the intermediate clock signal DIVB may be an inactive clock signal having a high clock level, for instance, responsive to the control signal GDEND1 having a logic low state.

A multiplexer 326 may be configured to receive the inverted clock signal DIVA and the intermediate clock signal DIVB and may selectively provide the clock signal DIVA or an inverted intermediate clock signal DIVB based on the complementary clock signals SCLK, SCLKF to provide the adjustable clock signal CLKDIVA. The multiplexer 328 may be configured to receive the intermediate clock signals DIVA, DIVB and may selectively provide an inverted intermediate clock signal DIVA or an inverted intermediate clock signal DIVB based on the complementary clock signals SCLK, SCLKF to provide the adjustable clock signal CLKDIVB.

A NAND gate 332 may receive the adjustable clock signal CLKDIVA and a supply voltage VCC and provide its output to an inverter 336. The inverter 336 may invert the output of the NAND gate 332 to provide the output clock signal CLK0. A NAND gate 334 may receive the adjustable clock signal CLKDIVB and the control signal GDEND2. The inverter 338 may invert the output of the NAND gate 334 to provide the output clock signal CLK90. During a full rate mode in which the control signal GDEND2 may have a logic low state, the output clock CLK90 may be an inactive clock signal having a low clock level.

In an example operation, the clock generator circuit 300 may operate in a full rate mode responsive to the control signal GDEN having a logic low state. Accordingly, the initialization circuit 240 may provide the control signals GDEND0, GDEND1, GDEND2 with a logic low state. The inverter 312 may receive the input clock signal GCLK and provide an inverted input clock signal to the phase splitter 314, which may phase split the inverted input clock signal to provide the complementary clock signals SCLK, SCLKF.

The complementary clock signals SCLK, SCLKF may be provided to each of the flip-flops 316, 318. Responsive to the control signals GDEND1F and GDEND0F having a logic low state, however, the divided clock signals DIVAF, DIVBF may be inactive clock signals having constant clock levels (recall that control signals GDEND0 and GDEND1 having a logic low state may set the flip-flops 316, 318, respectively).

The NAND gate 322 may receive the divided clock signal DIVAF and the control signal GDEND0 and the NAND gate 324 may receive the divided clock signal DIVBF and the control signal GDEND1. The NAND gates 322, 324 may in turn provide the intermediate clock signals DIVA, DIVB. As a result of the logic low state of the control signals GDEND0 and GDEND1, the intermediate clock signals DIVA, DIVB may each comprise a supply voltage.

The multiplexer 326 may receive the inverted intermediate clock signal DIVA and the intermediate clock signal DIVB and may provide the adjustable clock signal CLKDIVA based on the inverted intermediate clock signal DIVA and the intermediate clock signal DIVB. By way of example, the multiplexer 326 may comprise an inverted multiplexer and accordingly may selectively provide the intermediate clock signal DIVA or an inverted intermediate clock signal DIVB based on the complementary clock signals SCLK, SCLKF to provide the adjustable clock signal CLKDIVA. For example, where the inverted intermediate clock signal DIVA is a low clock level and the intermediate clock signal DIVB is a high clock level, the multiplexer 326 switches between providing as the CLKDIVA signal the high clock level of the intermediate clock signal DIVA signal and the low clock level of the inverted DIVB signal according to the frequency of the SCLK, SCLKF signals. In particular, the high clock level of the intermediate clock signal and the low clock level of the inverted DIVB signal are switched every half-clock cycle of the SCLK, SCLKF signals, resulting in a CLKDIVA signal having a frequency that is the same as the frequency of the SCLK, SCLKF signals. In summary, during the full rate mode, the adjustable clock signal CLKDIVA may be a full rate clock signal.

The multiplexer 328 may receive the intermediate clock signal DIVA and the intermediate clock signal DIVB and may provide the adjustable clock signal CLKDIVB based on the intermediate clock signal DIVA and the intermediate clock signal DIVB. By way of example, the multiplexer 328 may comprise an inverted multiplexer and accordingly may selectively provide the inverted intermediate clock signal DIVA or the inverted intermediate clock signal DIVB based on the complementary clock signals SCLK, SCLKF to provide the adjustable clock signal CLKDIVB. For example, where the intermediate clock signal DIVA is a high clock level and the intermediate clock signal DIVB is a high clock level, the multiplexer 326 switches between providing as the CLKDIVA signal the low clock level of the inverted DIVA signal and the low clock level of the inverted DIVB signal according to the frequency of the SCLK, SCLKF signals. As a result, the resulting in a CLKDIVA signal has a constant low clock level. In summary, during the full rate mode, the adjustable clock signal CLKDIVB may be an inactive clock signal having a low clock level.

The NAND gate 332 may receive the adjustable clock signal CLKDIVA and a supply voltage VCC and may provide its output to the inverter 336. The inverter 336 may inverse the output of the NAND gate 332 to provide the output clock signal CLK. The output clock signal CLK may comprise a full rate clock signal. A NAND gate 334 may receive the adjustable clock signal CLKDIVB and the control signal GDEND2 and may provide its output to the inverter 338. The inverter 338 may invert the output of the NAND gate 334 to provide the output clock signal CLK90. The output clock signal CLK90 may be an inactive clock signal having a low clock level.

In response to the control signal GDEN transitioning to a logic high state, the clock generator circuit 300 may operate in a reduced rate mode, and the initialization circuit 240 may provide control signals GDEND0, GDEND1, and GDEND2 with a logic high state. In response to the control signals GDEND0 and GDEND1 having a logic high state, the flip-flops 316, 318 of the clock divider circuit 310 may not be set and the complementary clock signals SCLK, SCLKF may be divided to provide the divided clock signals DIVAF, DIVBF.

Based on the divided clock signal DIVAF and the control signal GDEND0, the NAND gate 322 may provide the intermediate clock signal DIVA. Similarly, based on the divided clock signal DIVBF and the control signal GDEND1, the NAND gate 324 may provide the intermediate clock signal DIVB. The intermediate clock signals DIVA, DIVB may be provided to each of the multiplexers 326, 328. Based on the intermediate clock signals DIVA, DIVB and the complementary clock signals SCLK, SCLKF, the adjustable clock signals CLKDIVA, CLKDIVB may be provided. For example, assuming the inverted DIVA signal and the DIVB signal have frequencies that are half of the frequency of the SCLK, SCLKF signals, and the DIVB signal is phase shifted by 90 degrees, the multiplexer 326 switches between providing the inverted DIVA signal and the DIVB signal according to the frequency of the SCLK, SCLKF signals to provide a CLKDIVA signal that is half the frequency of the SCLK, SCLKF signals. In particular, the clock levels of the out of phase inverted DIVA signal and the DIVB signal are such that the switching of the multiplexer 326 at the frequency of the SCLK, SCLKF signals results in providing a low clock level (e.g., of the DIVA signal) for half a clock cycle of the SCLK, SCLKF signals, followed by another low clock level (e.g., of the inverted DIVB signal) for another half a clock cycle, followed by a high clock level (e.g., of the inverted DIVA signal) for half a clock cycle, and followed by another high clock level (e.g., of the DIVB signal) for half a clock cycle. Thus, the CLKDIVA signal has a frequency that is one-half of the SCLK, SCLKF signals. The CLKDIVB signal is likewise provided by the multiplexer 328 by switching between the DIVA signal and the DIVB signal according to the frequency of the SCLK, SCLKF signals, resulting in a CLKDIVB signal that is half the frequency of the SCLK, SCLKF signals, but phase shifted relative to the CLKDIVA signal. In summary, the adjustable clock signal CLKDIVA may be a reduced rate clock signal, and the adjustable clock signal CLKDIVB may be a phase shifted reduced rate clock signal.

The adjustable clock signal CLKDIVA may be provided to the NAND gate 332 and the inverter 336 and thereafter provided from the inverter 336 as the output clock signal CLK0. Similarly, the adjustable clock signal CLKDIVB may be provided to the NAND gate 334 and the inverter 338 and thereafter provided from the inverter 338 as the output clock signal CLK90. The output clock signal CLK0 may comprise a reduced rate clock signal, and the output clock signal CLK90 may comprise a phase shifted reduced rate clock signal.

Figure 4:
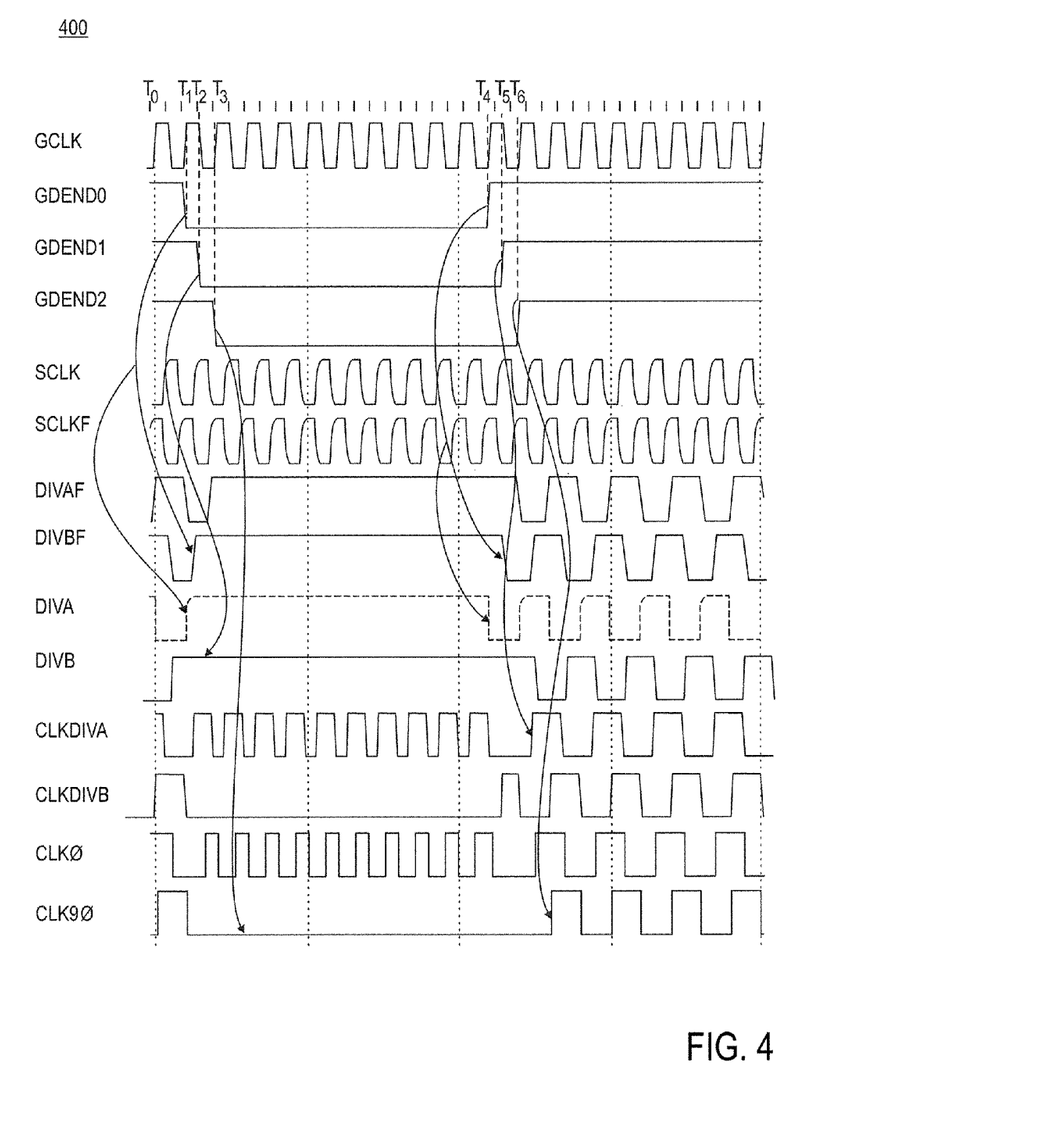
FIG. 4 is a timing diagram illustrating operation of the clock generator circuit of FIG. 3 according to an embodiment of the present invention.

FIG. 4 is a timing diagram illustrating operation of the clock generator circuit 300 of FIG. 3 according to an embodiment of the present invention. At a time T0, the clock generator circuit 300 may be operating in a reduced rate mode. Prior to a time T1, the control signal GDEN (not shown in FIG. 4) may transition to a logic low state, causing the clock generator circuit 300 to operate in a full rate mode, and resulting in the control signal GDEND0 transitioning to a logic low state at the time T1. In response, the divided clock signal DIVBF and the intermediate clock signal DIVA may be inactive clock signals having high clock levels. At a time T2, the control signal GDEND1 may transition to a logic low state. In response, the divided clock signals DIVAF and DIVBF may be inactive clock signals having high clock levels.

In response to both divided clock signals DIVAF, DIVBF being inactive high clock signals, the adjustable clock signal CLKDIVA, and in turn the output clock signal CLK0, may be provided as a full rate clock signal. As described, a full rate clock signal may be provided by selectively providing the intermediate clock signal DIVA (e.g., a high clock level) and the inverted intermediate clock signal DIVB (e.g., a low clock level) based on the complementary clock signals SCLK, SCLKF. For example, the multiplexer 326 switches between the high clock level of the DIVA signal and the low clock level of the inverted DIVB signal according to the frequency of the SCLK, SCLKF signals to provide the CLKDIVA signal (recall that the multiplexer 326 may comprise an inverted multiplexer), which is then provided through the NAND gate 332 and the inverter 336 as the CLK0 signal. The resulting CLKDIVA signal (and CLK0 signal) has a frequency that is the same as the frequency of the SCLK, SCLKF signals. At a time T3, the control signal GDEND2 may transition to a logic low state and as a result, the output clock signal CLK90 may be an inactive clock signal having a low clock level.

Prior to a time T4, the control signal GDEN may transition to a logic high state, causing the clock generator circuit 300 to operate in a reduced rate mode, and resulting in the control signal GDEND0 transitioning to a logic high state at the time T4. In response, the divided clock signal DIVBF may be provided by dividing the clock signal SCLK and the intermediate clock signal DIVA may be provided based on the divided clock signal DIVAF. At a time T5, the control signal GDEND1 may transition to a logic high state. In response, the divided clock signal DIVAF may be provided by dividing the clock signal SCLKF and the intermediate clock signal DIVB may be provided based on the divided clock signal DIVBF.

In response to the intermediate clock signals DIVA, DIVB being provided based on the divided clock signals DIVAF, DIVBF, respectively, the adjustable clock signal CLKDIVA, and in turn the output clock signal CLK0, may be provided as a reduced rate clock signal. For example, as previously discussed and as illustrated in FIG. 4, the clock levels of the out of phase inverted DIVA signal and the DIVB signal are such that the switching of the multiplexer 326 at the frequency of the SCLK, SCLKF signals the multiplexer 326 switches between providing the DIVA signal and the inverted DIVB signal (recall that the multiplexer 326 may comprise an inverted multiplexer) according to the frequency of the SCLK, SCLKF signals to provide a CLKDIVA signal that is half the frequency of the SCLK, SCLKF signals. The CLKDIVB signal is likewise provided by the multiplexer 328 by switching between the inverted DIVA signal and the inverted DIVB signal (recall that the multiplexer 328 may comprise an inverted multiplexer) according to the frequency of the SCLK, SCLKF signals, resulting in a CLKDIVB signal that is half the frequency of the SCLK, SCLKF signals, but phase shifted relative to the CLKDIVA signal. At a time T6, the control signal GDEND2 may transition to a logic high state and as a result, the output clock signal CLK90 may comprise a phase shifted reduced rate clock signal.

In this manner, clock generator circuits described herein may transition between a full rate mode and a reduced rate mode based on the control signal GDEN. In some examples, clock generator circuits may transition to other modes as well, although such modes are not described herein for the sake of brevity. In some examples, the control signal GDEN and/or the input clock signal GCLK may be provided by a memory controller (not shown) or any other external device.

As described, the output clock signal CLK0 may be provided as a full rate clock signal or a reduced rate clock signal, and may have a first frequency when provided as a full rate clock signal and may have a second frequency when provided as a reduced rate clock signal. The first frequency may be greater than the second frequency. Moreover, the output clock signal CLK0 may be provided as a full rate clock signal or a reduced rate clock signal using a same path. With reference to FIG. 3, for instance, the output clock signal CLK0 may be provided using the same components of the clock generator circuit 300 when provided as a full rate clock signal and when provided as a reduced rate signal. For example, in providing the output clock signal CLK0 either as a full rate clock signal or a reduced rate clock signal the same circuits of a clock divider circuit, multiplexer circuit, and driver circuit are used (e.g., the clock divider circuit 310, multiplexer circuit 320, and driver circuit 330). In this manner, timing mismatches arising from use of multiple clock paths may be mitigated.

Figure 5:
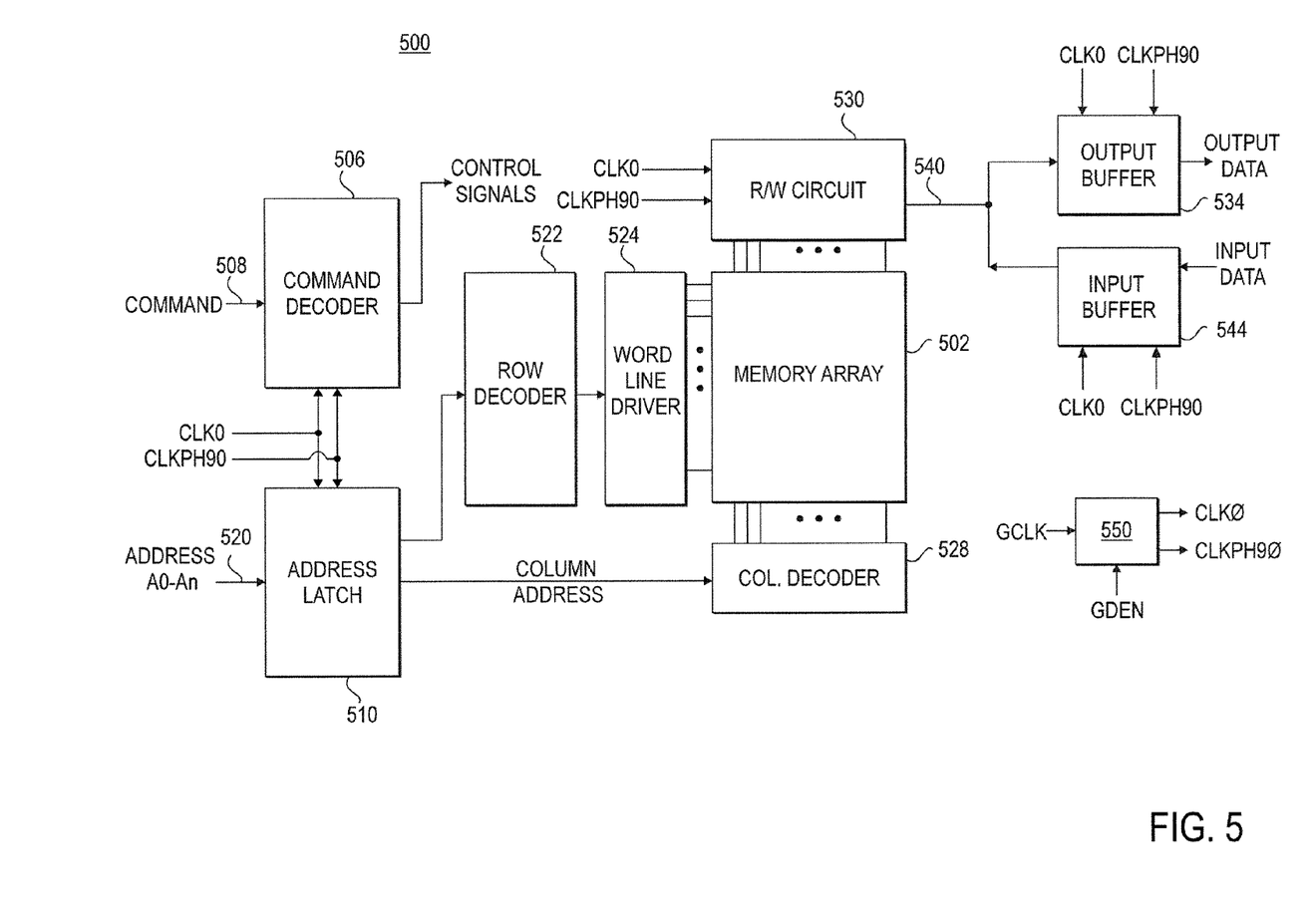
FIG. 5 is a block diagram of a memory according to an embodiment of the present invention.

FIG. 5 is a block diagram a memory 500 including an apparatus according to an embodiment of the present invention. The memory 500 includes an array 502 of memory cells, which may be, for example, volatile memory cells (e.g., DRAM memory cells, SRAM memory cells), non-volatile memory cells (e.g., NOR and NAND flash memory cells, phase change memory cells), or other types of memory cells. The memory 500 includes a command decoder 506 that receives memory commands and addresses through an ADDR/CMD bus. The command decoder 506 provides control signals, based on the commands received through the command bus 508. The command decoder 506 also provides row and column addresses to the memory 500 through an address bus 520 and an address latch 510. The address latch then outputs separate column addresses and separate row addresses.

The row and column addresses are provided by the address latch 510 to a row decoder 522 and a column decoder 528, respectively. The row decoder may, for instance, be configured to provide a row address based on a row address received from the address latch 510. The column decoder 508 selects bit lines extending through the array 502 corresponding to respective column addresses. The row decoder 510 may be coupled to word line driver 524 that activates respective word lines of memory cells in the array 502 corresponding to received row addresses. The selected data line (e.g., a bit line or bit lines) corresponding to a received column address is coupled to a read/write circuitry 530 to provide read data to a data output circuit 534 via an input-output data bus 540. Write data are provided to the array 502 through a data input circuit 544 and the memory array read/write circuitry 530. The command decoder 506 responds to memory commands and addresses provided to the command bus to perform various operations on the array 502. In particular, the command decoder 506 is used to provide control signals to read data from and write data to the array 502.

The memory 500 may further include a clock generator circuit 550 according to an embodiment of the invention. For example, the clock generator circuit 550 may be implemented using the clock generator circuit 102 of FIG. 1 previously described. The clock generator circuit 550 may be configured to receive an input clock signal GCLK and provide output clock signals CLK0 and CLK90 as described. The output clock signals CLK0 and CLK90 may be used for timing the operation of other circuits of the memory 500. In some embodiments, the clock signals CLK0 and CLK90 may be used to control the output buffers 516, the input buffer 518, the command decoder 506, the address latch 510, the read/write circuitry 530, or a combination thereof.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a clock generator circuit configured to selectively provide first and second intermediate clock signals to a multiplexer in a clock path to provide an output clock signal with a first frequency when operating in a first mode and to selectively provide the first and second intermediate clock signals to the multiplexer in the clock path to provide the output clock signal with a second frequency when operating in a second mode, wherein the first frequency is greater than the second frequency.

2. The apparatus of claim 1, wherein the first mode comprises a full rate mode and the second mode comprises a reduced rate mode.

3. The apparatus of claim 1, wherein the clock generator circuit is configured to receive an input clock signal, and wherein a frequency of the input clock signal is the first frequency.

4. An apparatus, comprising:
a clock generator circuit configured to selectively provide first and second intermediate clock signals to a multiplexer in a clock path to provide an output clock signal with a first frequency when operating in a first mode and to selectively provide the first and second intermediate clock signals to the multiplexer in the clock path to provide the output clock signal with a second frequency when operating in a second mode, wherein the clock generator circuit includes a phase splitter configured to receive an input clock signal and to provide complementary clock signals based, at least in part on the input clock signal, the clock generator circuit further configured to selectively provide the first and second intermediate clock signals based, at least in part, on the complementary clock signals.

5. The apparatus of claim 1, wherein the clock generator circuit is further configured to provide a phase shifted clock signal with the second frequency when operating in the second mode.

6. The apparatus of claim 5, wherein the clock generator circuit is further configured to provide an inactive clock signal and the output clock signal with the first frequency when operating in the first mode.

7. A clock generator circuit, comprising:
a clock divider circuit configured to receive an input clock signal and provide a plurality of divided clock signals based, at least in part, on the input clock signal;
a multiplexer circuit configured to receive the plurality of divided clock signals and to provide first and second intermediate clock signals based, at least in part, on the plurality of divided clock signals and a control signal, the multiplexer circuit further configured to selectively provide the first and second intermediate signals to provide an adjustable clock signal; and
a driver circuit configured to receive the adjustable clock signal and provide an output clock signal based, at least in part, on the adjustable clock signal,
wherein the output clock signal comprises a clock signal having a first frequency responsive to the clock generator circuit operating in a first mode and comprises a clock signal having a second frequency responsive to the clock generator circuit operating in a second mode, wherein the first frequency of the clock signal is different from the second frequency.

8. The clock generator circuit of claim 7, wherein a clock divider circuit configured to receive an input clock signal and provide a plurality of divided clock signals comprises:
the clock divider circuit configured to receive an input clock signal and phase split the input clock signal to provide a plurality of phase split clock signals, the clock divider circuit configured to divide each of the plurality of phase split clock signals to provide the plurality of divided clock signals.

9. The clock generator circuit of claim 7, wherein the output clock signal is a first output clock signal, the clock generator circuit further configured to provide a second output clock signal based on a second adjustable clock signal, and the second adjustable clock signal based on the first and second intermediate clock signals.

10. The clock generator circuit of claim 9, wherein the second output clock signal comprises an inactive clock signal when the clock generator circuit is operating in the first mode and comprises a phase shifted reduced rate clock signal when the clock generator circuit is operating in the second mode.

11. The clock generator circuit of claim 7, wherein the multiplexer circuit further configured to selectively provide the first and second intermediate signals to provide an adjustable clock signal comprises:
a multiplexer circuit configured to switch between providing the first and second intermediate signals according to a toggle of an output of a multiplexer to provide the adjustable clock signal.

12. The clock generator circuit of claim 7, wherein the clock generator circuit is configured to operate in the first mode responsive to the control signal having a first state and to operate in the second mode responsive to the control signal having a second state.

13. A method, comprising
receiving an input clock signal;
receiving a control signal;
responsive to the control signal having a first state, providing an output clock signal with a clock path, the output clock signal having a first frequency and based, at least in part, on the input clock signal;
responsive to the control signal having a second state, providing the output clock signal with the clock path, the output clock signal having a second frequency and based, at least in part, on the input clock signal and wherein first frequency is twice the second frequency.

14. A method, comprising:
receiving an input clock signal;
phase splitting the input clock signal to provide complementary clock signals;
receiving a control signal;
responsive to the control signal having a first state, providing an output clock signal with a clock path, the output clock signal having a first frequency and based, at least in part, on the input clock signal; and
responsive to the control signal having a second state, providing the output clock signal with the clock path, the output clock signal having a second frequency and based, at least in part, on the input clock signal.

15. The method of claim 13, wherein the output clock signal comprises a first output clock signal, the method further comprising:
responsive to the control signal having the first state, providing a second output clock signal, the second output clock signal comprising an inactive clock signal; and
responsive to the control signal having the second state, providing the second output clock signal, the second output clock signal comprising a phase shifted reduced rate clock signal.

16. A method, comprising:
receiving an input clock signal;
receiving a control signal;
responsive to the control signal having a first state, providing an output clock signal with a clock path, the output clock signal having a first frequency and based, at least in part, on the input clock signal by switching the output of a multiplexer to selectively provide first and second intermediate clock signals according to complementary clock signals having the first frequency; and
responsive to the control signal having a second state, providing the output clock signal with the clock path, the output clock signal having a second frequency and based, at least in part, on the input clock signal.

17. A method, comprising:
receiving an input clock signal and a control signal;
providing complementary clock signals based, at least in part, on the input clock signal;
providing first and second intermediate clock signals based, at least in part, on the control signal; and
selectively providing an adjustable clock signal from an output of a multiplexer based on the complementary clock signals to provide an output clock signal, the adjustable clock signal based on the first and second intermediate clock signals,
wherein the output clock signal comprises a full rate clock signal responsive to the control signal having a first state and comprises a reduced rate clock signal responsive to the control signal having a second state.

18. The method of claim 17, wherein the multiplexer is a first multiplexer and the adjustable clock signal is a first adjustable clock signal and wherein the method further comprises:
selectively providing the second adjustable clock signal from an output of a second multiplexer based on the complementary clock signals to provide a second output signal, the second adjustable clock signal based on the first and second intermediate clock signals,
wherein the second output signal comprises an inactive clock signal responsive to the control signal having the first state and comprises a phase shifted reduced rate clock signal responsive to the control signal having the second state.

19. The method of claim 17, wherein providing first and second intermediate clock signals based, at least in part, on the control signal comprises:
dividing the complementary clock signals to provide divided clock signals having frequencies less than the input clock signal.

20. The method of claim 17, wherein the first and second intermediate clock signals comprise first and second inactive clock signals responsive to the control signal having the first state and wherein the first and second intermediate clock signals comprise first and second active clock signals responsive to the control signal having the second state.

21. The method of claim 17, wherein providing complementary clock signals based, at least in part, on the input clock signal comprises phase splitting the input signal.

* * * * *